(12) United States Patent
Nakanishi et al.

(10) Patent No.: US 6,501,156 B1
(45) Date of Patent: Dec. 31, 2002

(54) LEAD FRAME WHICH INCLUDES A DIE PAD, A SUPPORT LEAD, AND INNER LEADS

(75) Inventors: Hideyuki Nakanishi, Shiga (JP); Shin'ichi Ijima, Osaka (JP); Akio Yoshikawa, Kyoto (JP); Ryuma Hirano, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 21 days.

(21) Appl. No.: 09/657,484

(22) Filed: Sep. 8, 2000

(30) Foreign Application Priority Data

Sep. 10, 1999 (JP) ............................. 11-257050

(51) Int. Cl.⁷ ..................... H01L 23/12; H01L 23/28; H01L 23/50
(52) U.S. Cl. ................. 257/666; 257/684; 257/696; 257/698; 257/796; 257/675; 257/712; 257/676; 257/775; 257/713; 257/692; 257/693; 257/707; 257/711; 257/432; 257/433; 257/99; 257/725; 257/728
(58) Field of Search ................. 257/666, 676, 257/669–672, 675, 684, 690–693, 696, 698, 728, 725, 712, 710, 704, 709, 711, 432, 433, 434, 435, 99, 100, 713, 775

(56) References Cited

U.S. PATENT DOCUMENTS

| | | | | |
|---|---|---|---|---|
| 5,454,905 A | * | 10/1995 | Fogelson | 156/651.1 |
| 5,656,855 A | * | 8/1997 | Fukase et al. | 257/676 |
| 5,691,241 A | | 11/1997 | Kazutaka | 257/676 |
| 5,977,615 A | * | 11/1999 | Yamaguchi et al. | 257/666 |
| 6,081,029 A | * | 6/2000 | Yamaguchi | 257/718 |
| 6,130,115 A | * | 10/2000 | Okumura et al. | 257/676 |
| 6,143,981 A | * | 11/2000 | Glenn | 257/666 |
| 6,166,430 A | * | 12/2000 | Yamaguchi | 257/666 |
| 6,208,023 B1 | * | 3/2001 | Nakayama et al. | 257/696 |
| 6,229,200 B1 | * | 5/2001 | McIellian et al. | 257/684 |
| 6,274,927 B1 | * | 8/2001 | Glenn | 257/704 |
| 6,281,568 B1 | * | 8/2001 | Glenn et al. | 257/684 |
| 6,338,984 B2 | * | 1/2002 | Minamio et al. | 257/666 |

FOREIGN PATENT DOCUMENTS

| | | |
|---|---|---|
| EP | 0 790 652 | 8/1997 |
| JP | 53-126268 | 11/1978 |
| JP | 01-106456 | 4/1989 |
| JP | 01-150347 | 6/1989 |
| JP | 03-064058 | 3/1991 |
| JP | 03-147358 | 6/1991 |
| JP | 04-340265 | 11/1992 |
| JP | 5-326788 | 12/1993 |
| JP | 6-203403 | 7/1994 |

\* cited by examiner

*Primary Examiner*—Alexander O. Williams
(74) *Attorney, Agent, or Firm*—Merchant & Gould P.C.

(57) ABSTRACT

A lead frame includes a die pad including a die pad main portion having a large thickness and a die pad peripheral portion having an intermediate thickness smaller than that of the die pad main portion, provided on at least one side of the die pad main portion, at least one support lead connected to the die pad, and at least two first inner leads having a small thickness smaller than that of the die pad peripheral portion, arranged such that end portions thereof are opposed to the die pad peripheral portion. The thick die pad provides good heat release properties, and reducing the thickness of the leads allows fine pitched leads to be produced. Such a lead frame can be manufactured easily by press stamping after belt-shaped regions having different thickness are formed by rolling.

23 Claims, 4 Drawing Sheets

LEAD FRAME WHICH INCLUDES A DIE PAD, A SUPPORT LEAD, AND INNER LEADS

BACKGROUND OF THE INVENTION

1. Field of the Invention

The present invention relates to a lead frame and a resin package using the lead frame. Furthermore, the present invention relates to a miniature photoelectron device on which a high output semiconductor laser is mounted, using the resin package.

2. Description of the Related Art

A photoelectron device including an optical semiconductor element is known, for example, from JP 6-203403A. This publication discloses the following photoelectron device. A lead frame including a die pad and inner leads whose end portions are arranged in the vicinity of the periphery of the die pad is produced, and then the lead frame is sealed with a resin to produce a resin package. This resin package is provided with an opening for exposing the die pad and the end portions of the inner leads. Then, an optical semiconductor element is mounted on the die pad in the opening, and the electrodes of the optical semiconductor element are connected by wiring to the corresponding end portions of the inner leads exposed in the periphery of the die pad. Finally, a transparent optical member is provided in the opening to seal the optical semiconductor element.

For use, such a photoelectron device is mounted on an optical pick-up device or the like that records and/or reproduces an optical recording medium such as an optical disk.

There is a tendency to pursue further miniaturization for optical disk devices, and therefore there is an increasing demand for a miniature photoelectron device. One approach to promote the miniaturization of the photoelectron device is to attain a finer pitch for inner leads constituting a lead frame.

In general, the pitch of arranged inner leads is restricted by the thickness thereof, and reducing the thickness of the inner leads is effective for the miniaturization of the pitch of the arranged inner leads. JP 5-326788A discloses a semiconductor device including fine pitched inner leads, produced by pressing the end portions of the inner leads of multiple pins to reduce the thickness. In this disclosure, the end portions of the inner leads of the lead frame produced by rolling are pressed so that the thickness thereof is reduced to ⅙ at the largest, and thus thinner inner leads can be obtained.

However, conventional photoelectron devices or semiconductor devices and methods for producing these devices have the following problems.

With the increasing capacity and further miniaturization of optical disk devices, high output is required for a semiconductor laser for an optical pick-up device, and miniaturization is required for a package on which the semiconductor laser is to be mounted. Heat generation increases when the output of the semiconductor laser is raised, and therefore good heat release properties are required. On the other hand, fine pitched inner leads are required for miniaturization. However, a resin package that achieves both good heat release properties and fine pitch has not been attained yet.

This is due to the following reason. When a die pad portion is thicker than a regular lead frame in order to ensure heat release properties, thin end portions of the inner leads, which are necessary for fine pitch, cannot be produced with high precision. In a photoelectron device including an optical semiconductor element, the optical characteristics are attained by providing an opening in a resin package to expose the die pad and the end portions of the fine pitched inner leads, and mounting an optical semiconductor element on the die pad in the opening. Therefore, when the thickness of the inner leads is reduced for fine pitch, the strength of the end portions of the thin inner leads exposed in the opening is degraded so that deformation or other problem is likely to occur. Even slight deformation of the end portions of the exposed inner leads may cause deterioration of the optical characteristics or peeling between the resin and the lead end portions.

Furthermore, for the photoelectron device for optical pick-up, miniaturization is desired, particularly in one direction of the package for convenience in its installation and arrangement. The conventional photoelectron devices are substantially rectangular in plan, and it is becoming difficult to attain further reduction of the size in the direction of the shorter side of the rectangle.

SUMMARY OF THE INVENTION

Therefore, with the foregoing in mind, it is an object of the present invention to provide a lead frame including fine pitched inner leads and a die pad having a thickness necessary for good heat release properties. Furthermore, it is another object of the present invention to provide a lead frame having good adhesion with a sealing resin. Furthermore, it is another object of the present invention to provide a lead frame that has such characteristics and is produced easily and inexpensively.

Furthermore, it is an object of the present invention to provide a resin package that achieves both miniaturization and heat release properties. Furthermore, it is another object of the present invention to provide a resin package having good adhesion between the resin and the die pad and the leads. Furthermore, it is another object of the present invention to provide a resin package that has such characteristics and is produced easily and inexpensively.

Furthermore, it is an object of the present invention to provide a miniature photoelectron device having good heat release properties that can be used with high output, has high performance and is produced inexpensively.

A first lead frame of the present invention includes a die pad including a die pad main portion having a large thickness and a die pad peripheral portion having an intermediate thickness smaller than that of the die pad main portion, provided on at least one side of the die pad main portion, at least one support lead connected to the die pad, and at least two first inner leads having a small thickness smaller than that of the die pad peripheral portion, arranged such that the end portions thereof are opposed to the die pad peripheral portion.

According to the first lead frame, in the case where the end portions of the thin first inner leads are opposed to at least one side of the thick die pad main portion, the die pad peripheral portion having an intermediate thickness is formed on the side of the die pad main portion to which the first inner leads are opposed. When the region having an intermediate thickness is provided between the thick region and the thin region having significantly different thicknesses, a drastic change in the thickness can be eliminated, and the regions can be formed at one time by rolling. As a result, the thickness of the die pad necessary for heat release properties and the reduction of the thickness of the end portions of the inner leads necessary for fine pitch can be achieved at the same time. Thereafter, miniature leads can be formed easily by press stamping. Therefore, the lead frame including the fine pitched inner leads and the die pad having good heat release properties can be obtained easily and inexpensively.

A second lead frame of the present invention includes a die pad including a die pad main portion having a large thickness, at least one support lead connected to the die pad, and at least three first inner leads having a small thickness smaller than that of the die pad main portion, arranged such that the end portions thereof are opposed to at least one side of the die pad. Each first inner lead has a narrow portion having a small width and a wide portion having a width larger than that of the narrow portion. The narrow portion is positioned on the die pad side, and the wide portion is positioned on the side opposite to the die pad. A connection point between the narrow portion and the wide portion of the central first inner lead of the at least three first inner leads is positioned farther from the die pad than connection points between the narrow portions and the wide portions of first inner leads adjacent to the central first inner lead. The gap between the central first inner lead and the adjacent first inner leads is smaller in the narrow portion than in the wide portion.

According to the second lead frame, with respect to the connection points between the narrow portions and the wide portions of the first inner leads, the inner lead positioned farther from the center has a connection point nearer the die pad. For this reason, the first inner lead positioned farther from the center has the longer wide portion. Therefore, the strength of the thin first inner leads can be kept high even in the vicinity of the end portions thereof Therefore, deformation can be suppressed during processing. The strength of the exposed end portions from the sealing resin can be improved, and deformation hardly occurs. Thus, peeling from the resin after resin-sealing can be suppressed. In addition, since the lead gap is smaller in the narrow portion, fine pitched first inner leads can be achieved as well. Furthermore, the thick die pad main portion allows good heat release properties.

A third lead frame of the present invention includes a belt-shaped thick region having a large thickness and a belt-shaped thin region having a thickness smaller than that of the thick region, these regions being in parallel with each other. A die pad is formed in the thick region, and leads are formed in the thin region, and the leads extend in a direction substantially perpendicular to that of the belt-shaped region.

According to the third lead frame, a die pad is formed in a belt-shaped thick region, so that the heat release properties are good. Leads are formed in a belt-shaped thin region, so that fine pitched leads can be attained. These belt-shaped regions having different thicknesses are in parallel with each other, and therefore can be obtained easily by rolling. In addition, since the leads extend in the direction substantially perpendicular to the direction in which the belt-shaped regions are formed, the thickness of the leads in the extending direction is uniform. Therefore, fine pitched leads can be produced easily and highly precisely. In addition, the processed leads hardly are deformed. Thus, a lead frame having fine pitched inner leads and good heat release properties can be obtained easily and inexpensively.

In another aspect of the present invention, a first resin package of the present invention includes a die pad including a die pad main portion having a large thickness and a die pad peripheral portion having an intermediate thickness smaller than that of the die pad main portion, provided on at least one side of the die pad main portion, at least one support lead connected to the die pad, at least two first inner leads having a small thickness smaller than that of the die pad peripheral portion, arranged such that the end portions thereof are opposed to the die pad peripheral portion, and a resin for sealing the die pad, the support lead and the first inner leads for integration while exposing a part of an upper surface and a part of a lower surface of the die pad and upper surfaces of the end portions of the first inner leads.

The first resin package is obtained by sealing the first lead frame with a resin, and this embodiment allows a resin package with good heat release properties including fine pitched inner leads to be manufactured easily and inexpensively.

A second resin package of the present invention includes a die pad including a die pad main portion having a large thickness, at least one support lead connected to the die pad, at least three first inner lead having a small thickness smaller than that of the die pad main portion, arranged such that the end portions thereof are opposed to at least one side of the die pad, a resin for sealing the die pad, the support lead and the first inner leads for integration while exposing a part of the upper surface and a part of the lower surface of the die pad and upper surfaces of the end portions of the first inner leads. Each first inner lead has a narrow portion having a small width and a wide portion having a width larger than that of the narrow portion. The narrow portion is positioned on the die pad side, and the wide portion is positioned on the side opposite to the die pad. A connection point between the narrow portion and the wide portion of the central first inner lead of the at least three first inner leads is positioned farther from the die pad than connection points between the narrow portions and the wide portions of first inner leads adjacent to the central first inner lead. The gap between the central first inner lead and the adjacent first inner leads is smaller in the narrow portion than in the wide portion.

The second resin package is obtained by sealing the second lead frame with a resin, and reduces peeling of the fine pitched first inner leads from the resin. Furthermore, the strength of the end portions exposed from the sealing resin can be improved. The thick die pad main portion allows good heat release properties.

In yet another aspect of the present invention, a photoelectron device of the present invention includes the first or second resin package, a photoelectron element mounted on the upper surface of the die pad, and an optically transparent member for sealing the photoelectron element.

Since such a photoelectron device has fine pitched inner leads, it can be miniature, and since it has a thick die pad, the heat release properties can be good. Such a photoelectron device can be manufactured easily and inexpensively.

These and other advantages of the present invention will become apparent to those skilled in the art upon reading and understanding the following detailed description with reference to the accompanying figures.

DESCRIPTION OF THE PREFERRED EMBODIMENTS

Hereinafter, preferred embodiments of the present invention will be described with reference to the accompanying drawings.

Embodiment 1

Figure 1:
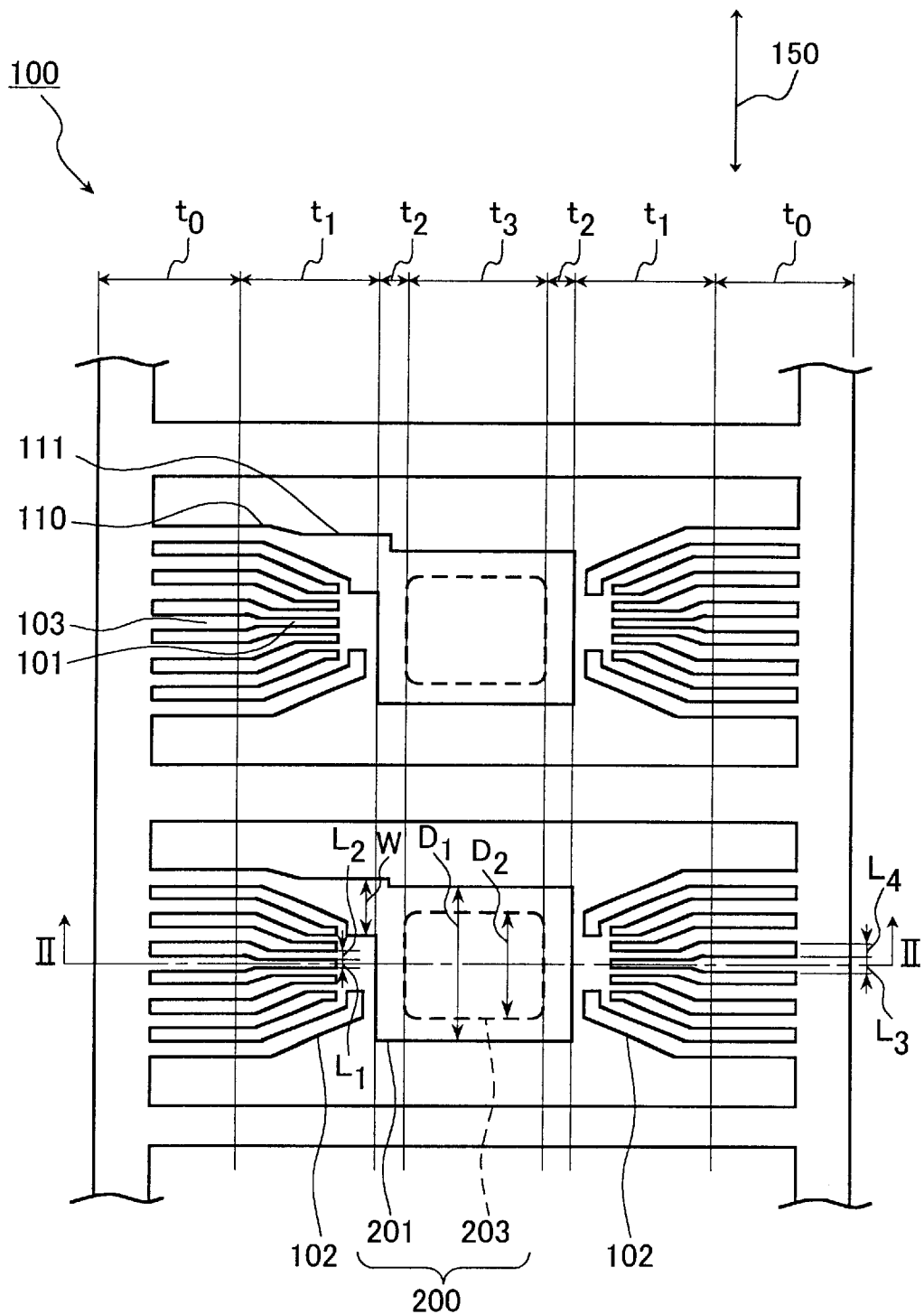
FIG. 1 is a plan view of a lead frame of Embodiment 1 of the present invention.
Figure 2:
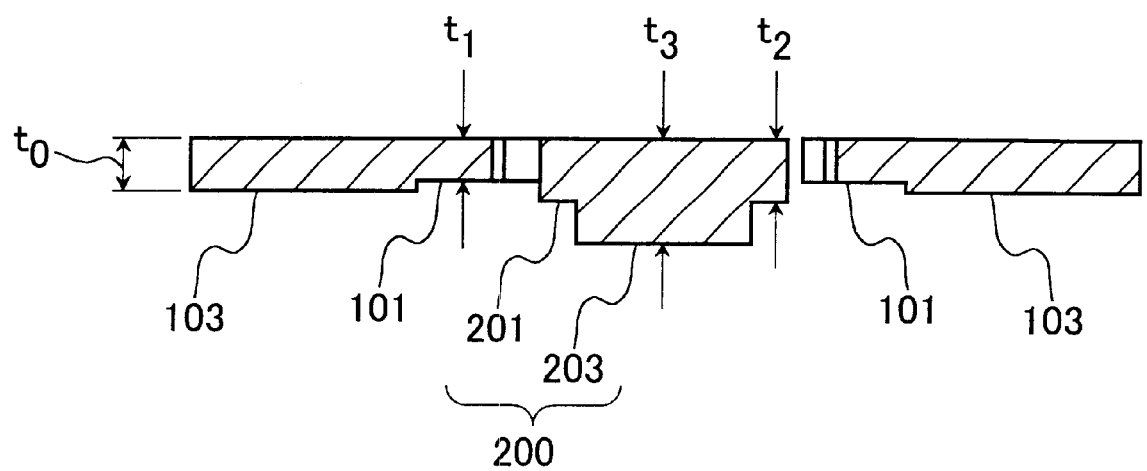
FIG. 2 is a cross-sectional view taken along line II—II of FIG. 1 from the direction indicated by the arrow.

FIG. 1 is a plan view of a lead frame of the present invention. FIG. 2 is a cross-sectional view taken along line II—II of FIG. 1 from the direction indicated by the arrow.

A lead frame 100 is obtained by rolling a plate-like metal member in a direction indicated by arrow 150, forming a plurality of belt-shaped regions that have different thicknesses parallel to the rolling direction 150, and press-stamping the rolled metal member into a pattern in plan as shown in FIG. 1. More specifically, the lead frame has belt-shaped regions parallel to the rolling direction 150, and the belt-shaped regions have a thickness of t0, t1, t2, or t3, where t0>t1<t2<t3 is satisfied. The upper surfaces of the regions are present substantially on a common plane, and the thickness of the each region is changed by changing the position of the lower surface. FIG. 1 shows only two repeating units, but a practical lead frame has a large number of such units that are repeated continuously in the rolling direction 150.

A die pad 200 includes a die pad main portion 203 having a large thickness (t3=0.5 to 0.7 mm) and a die pad peripheral portion 201 having an intermediate thickness (t2=0.3 to 0.45 mm) that is provided around the die pad main portion 203. The shape in plan of the die pad 200 is substantially rectangular, and the die pad 200 is provided in such a manner that the shorter side of the rectangle is parallel to the rolling direction 150.

The lead frame further includes a plurality of leads extending in the direction substantially perpendicular to the rolling direction 150 on the sides of both shorter sides of the die pad 200. Each lead is thinner than the die pad peripheral portion 201 having an intermediate thickness (t2), and has at least two variations in thickness. More specifically, each lead has a portion with a thickness t0 of 0.25 to 0.3 mm on the outer lead side and a thinner portion with a small thickness t1 of around 0.2 mm on the inner lead side. The leads are provided so as to extend in the direction substantially perpendicular to the rolling direction 150 so that each portion of the lead in the extending direction can be uniform in thickness. Therefore, a fine pitching process of the leads can be performed with ease and with high precision. Furthermore, the processed leads are hardly deformed.

The die pad 200 is connected to a support lead 110 so as to be held. A connection portion 111 of the support lead 110 that is connected to the die pad 200 has a small thickness (t1), and the width W thereof in the rolling direction 150 is larger than that of other leads for the strength purpose. The width W preferably is about 1.5 to 3 times larger than the width in the same direction of the end portions of first inner leads 101, which will be described later.

The first inner leads 101 are provided in such a manner that the end portions thereof are opposed to the shorter side of the die pad 200. In an example of FIG. 1, five first inner leads 101 are arranged on each of the right and left sides of the die pad 200. The width (L1) of the end portion of each first inner lead 101 is 0.15 mm. The arrangement gap (L2) between the end portions of the first inner leads 101 is 0.15 mm. The first inner leads 101 are connected to outer leads 103 on the side opposite to the die pad 200. The width (L3) of each outer lead 103 is 0.25 mm. The arrangement gap (L4) between the outer leads 103 is 0.25 mm. Also the support lead 110 is connected to the same outer lead 103 as above on the side opposite to the die pad 200. The distinction between "inner" and "outer" used herein with the leads is based on whether the leads are exposed from the periphery of a resin package produced by resin sealing as described later.

The width of each first inner lead 101 has two variations, that is, a small width on the end portion side (on the side of the die pad 200) and a larger width on the opposite side (on the side of the outer lead 103). Hereinafter, a portion having a small width is referred to as "narrow portion" and a portion having a width larger than that of the narrow portion is referred to as "wide portion". The position of the point (connection point) at which the narrow portion is turned into the wide portion is determined by the position of the first inner lead 101. More specifically, the central first inner lead of the five first inner leads arranged on one side of the die pad 200 has a connection point at the position farthest from the die pad 200, when compared with the other first inner leads. The two first inner leads adjacent to the central inner lead have connection points at positions nearer the die pad 200 than the central first inner lead. The two outermost first inner leads have connection points at positions even nearer the die pad 200. While varying the positions of the connection points in this manner, the gap between the first inner leads 101 is smaller in the narrow portion than in the wide portion. As a result, the first inner lead 101 positioned farther from the central first inner lead has the longer wide portion. Therefore, the strength of the thin first inner leads can be kept high even in the vicinity of the end portion thereof. Consequently, deformation during processing can be suppressed. Furthermore, the strength of the end portions exposed from a sealing resin can be improved, so that deformation hardly occurs. Therefore, peeling from the resin can be suppressed when resin sealing is performed as described later. Moreover, in addition to these effects, fine pitched end portions of first inner leads 101 can be achieved.

These leads are formed by rolling to a predetermined thickness and then each lead is provided with a predetermined width by press stamping. The gap between the leads and between the leads and the die pad 200 is substantially equal to the width of the lead. Since the thickness of the lead can be reduced, miniaturization can be possible with press stamping, and pressing for correcting deformation of the leads is not necessary after processing.

When the thickness of the die pad 200 on which a photoelectron device is to be mounted is increased, the heat release properties become better. In forming the die pad main portion 203 having a thickness t3 larger than thickness t0 of the outer lead portion by rolling, the die pad peripheral portion 201 having a thickness t2 (t0<t2<t3) is provided in the periphery of the die pad 200. With this portion, the variation extent can be changed stepwise during formation. Thus, rolling formability can be better (buffer effect).

On the other hand, decreasing the thickness of the leads is effective to achieve fine pitched leads. In forming thin leads having a thickness t1 in the vicinity of the thick die pad 200 having a thickness t3, the die pad peripheral portion 201 having an intermediate thickness between the thickness of the thin lead and the thickness of the thick die pad is formed to improve the rolling formability (buffer effect). As a result, fine pitched thin inner leads can be arranged with high precision between a length of about 1 mm, which is the length of the shorter side of the die pad 200.

A thin second inner lead 102 having a thickness t1 and a width L3 is formed outside the arranged plurality of first inner leads 101. The end portion of the second inner lead 102 having the same width L3 and thickness t1 curves toward the gap between the end portions of the first inner leads 101 and the die pad peripheral portion 201 and extends in the rolling direction 150. The end portion of the second inner lead 102 (more precisely, the outer edge of the end portion of the second inner lead 102 in the direction of the shorter side of the die pad 200) is positioned within a range defined by the width of the die pad 200 in the direction of the shorter side. This makes it possible to reduce the length of the shorter side necessary for arrangement of the necessary number of leads, when they are arranged in such a manner that the end portions thereof are opposed to the shorter side of the die pad 200. Therefore, further miniaturization in the direction perpendicular to the lead-extending direction (shorter side direction) can be promoted. Therefore, this arrangement can be used preferably in a photoelectron device used for an optical pick-up for an optical disk device, particularly for which further miniaturization is required. Furthermore, as in the arrangement of the leads on the right side of the die pad 200 of FIG. 1, when the second inner leads 102 are arranged in such a manner that the first inner leads 101 are interposed therebetween, further miniaturization in the shorter side direction can be achieved with the same number of leads. Also the second inner leads 102 are connected to the same outer leads 103 as those connected to the first inner leads 101 on the side opposite to the die pad 200.

In this embodiment, in forming belt-shaped regions having different thicknesses in parallel with the rolling direction 150 in the lead frame, a region having an intermediate thickness (t2) is provided between a thick region (a thickness t3) for the die pad main portion 203 and a thin region (a thickness t1) for the first inner leads 101 opposed thereto. The die pad peripheral portion 201 is provided in the region having an intermediate thickness. Thus, a buffer effect during rolling formation and reduction of the shearing area for press stamping make it possible to produce fine pitched first inner leads 101. In addition, deformation of the first inner leads 101 can be suppressed during stamping. Thus, in order to form a thick die pad 200 and fine pitched thin leads having a different thickness from the die pad 200 closely and precisely, it is preferable to provide the intermediate region having an intermediate thickness between the thickness of the former and the thickness of the latter in a region between the former and the latter. This reduces a change in thickness, so that an integrated lead frame can be formed precisely and efficiently by rolling. Furthermore, in the subsequent press stamping, since the thickness is changed gradually, deformation of the leads can be prevented, especially during stamping of the thin region.

The above-described embodiment is particularly effective when the thickness t3 of the die pad 200 is at least twice the thickness t1 of the thin region of the first inner leads.

Embodiment 2

Next, a resin package and a photoelectron device will be described.

Figure 3:
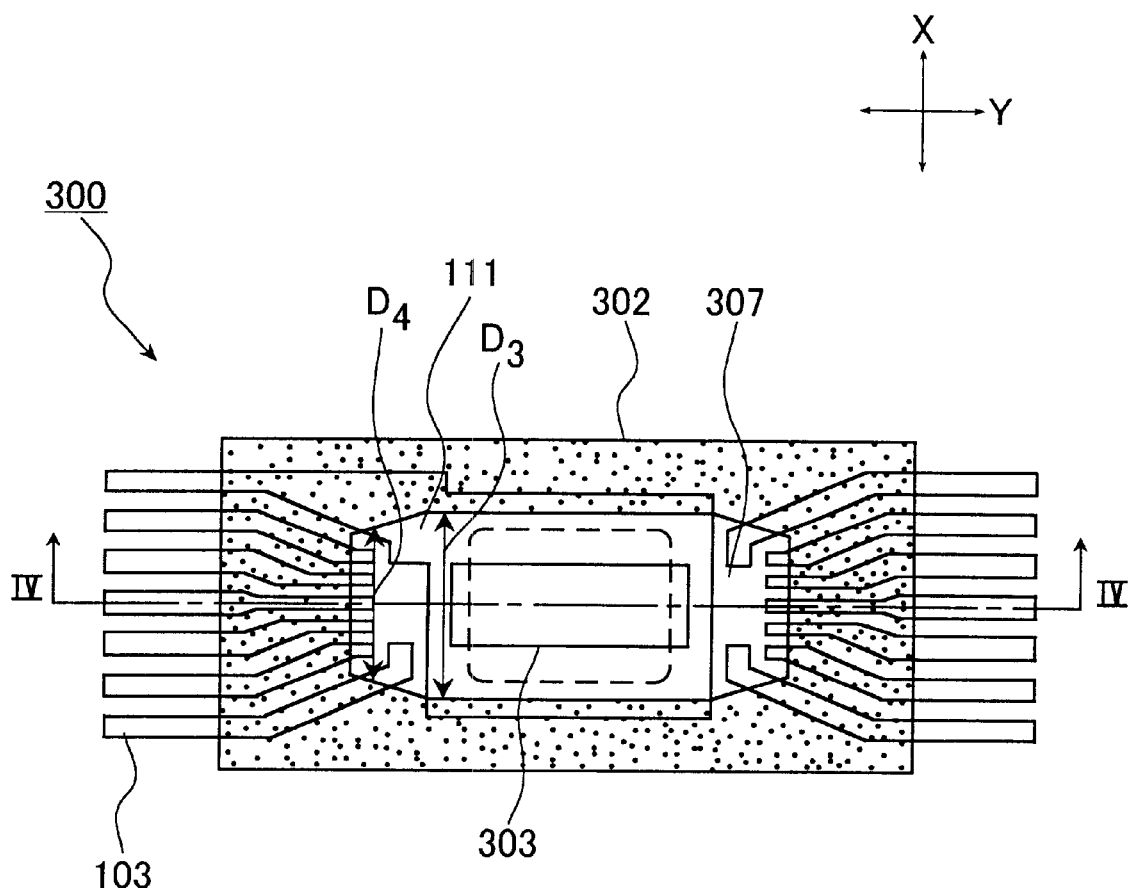
FIG. 3 is a plan view of a photoelectron device of Embodiment 2 of the present invention.
Figure 4:
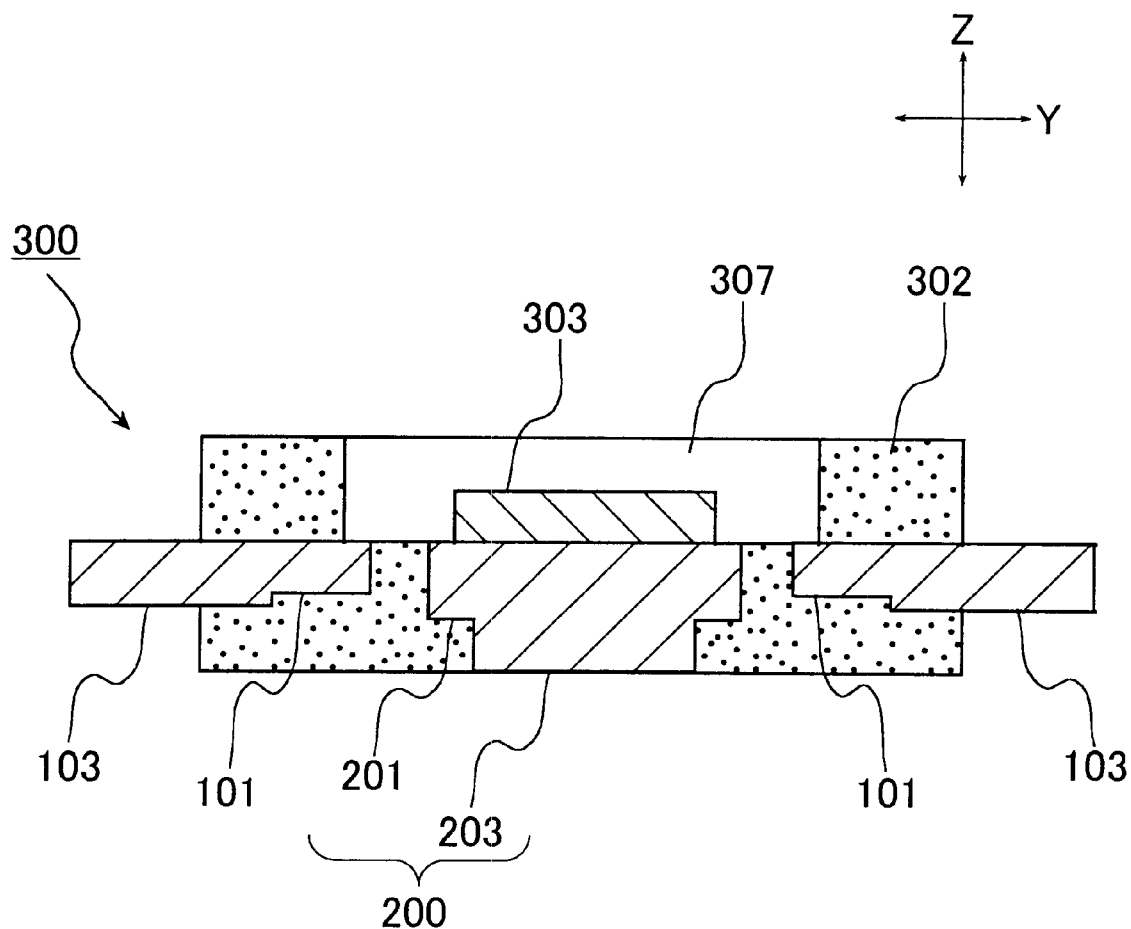
FIG. 4 is a cross-sectional view taken along line IV—IV of FIG. 3 from the direction indicated by the arrow.

FIG. 3 is a plan view of a photoelectron device 300 obtained by sealing the lead frame 100 of Embodiment 1 with a resin 302 so as to provide a resin package, mounting a photoelectron element 303 thereon, and cutting the lead frame into individual devices. In order to illustrate the internal structure, the resin 302 is translucent so that the portion covered by the resin 302 can be shown explicitly in FIG. 3. FIG. 4 is a cross-sectional view taken along line IV—IV of FIG. 3 from the direction indicated by the arrow. For convenience, a X-Y-Z rectangular coordinate system as shown in FIGS. 3 and 4 is used. The X axis direction corresponds to the rolling direction 150 in FIG. 1, and the Z axis direction corresponds to the vertical direction (thickness direction) of the resin package.

The resin 302 is formed in a substantially rectangular solid shape, and the outer leads 103 are exposed from both end faces of the resin 302. An opening 307 is provided on the upper surface of the resin package, and the die pad 200, the connection portion 111 of the support lead 110 that is connected to the die pad 200, the end portions of the first inner leads 101, and the end portions of the second inner leads 102 are exposed in the opening. As shown in FIG. 4, the upper surfaces of the metal portions such as the die pad 200 and the first inner leads 101 in the opening 307 are substantially flush with the upper surface of the resin 302 surrounding the metal portions. Such an opening 307 can be formed by performing the resin-sealing while placing a mold in a portion corresponding to the opening 307. The lower surface of the die pad main portion 203 of the die pad 200 is exposed in the lower surface of the resin package. Exposing a part of the die pad 200 allows efficient heat release for the photoelectron element 303 mounted on the die pad 200 via this exposed portion.

The width of the die pad 200 in the shorter side direction (X axis direction) is D1, and the width of the die pad main portion 203 in the same direction is D2 (see FIG. 1). This stepwise change in thickness on the side of the longer side on the lower surface of the die pad 200 can increase an area that is in contact with the resin 302, so that the adhesiveness with the resin can be improved. As a result, the thickness in the X axis direction of the resin adhering on the side of the longer side of the die pad 200 can be small, so that the size of the resin package in the X axis direction can be reduced further. The portions having different thicknesses on the side of the longer side of the die pad 200 as above can be formed, for example, during rolling or the subsequent press stamping in the process of manufacturing the lead frame.

The width of the opening 307 in the X axis direction is D3 in the portion of the die pad 200. The width D3 of the opening is smaller than the width D1 in the shorter side direction of the die pad 200. This allows the longer side portion of the die pad 200 to be fixed firmly with resin from the upper and lower directions. The difference between D1 and D3, namely, the overlapping width of the resin, can be suitably determined in view of the fixing strength of the die pad 200 and the opening width necessary for the opening 307.

The width of the opening 307 in the X axis direction is D4 in the vicinity of the arranged end portions of the first inner leads 101. D4 is smaller than D3. This allows improved fixing strength of the end portions of first inner leads 101 and second inner leads 102, and the connection portion 111 of the support lead 110.

Furthermore, the lengths of the portions of the first inner leads 101 and the second inner leads 102 that are exposed in the opening 307 are shorter than those of the portions sealed with the resin 302. Sealing most parts of the inner leads improves the fixing strength of the inner leads. Moreover, deformation of the end portions or peeling from the resin hardly occur. Furthermore, with respect to the outer lead side, resin-sealing is performed up to the portion having the same width (L3) and the same thickness (t0) as those of the outer leads 103. Thus, the outer leads 103 are fixed firmly.

The end portion of each lead exposed in the opening 307 is connected to the photoelectron element 303 by wiring. Therefore, the shape and the size of the opening 307 are designed so as to obtain peripheral space and regions necessary for this connection.

It is preferable to form a wide connection portion 111 of the support lead 110 that is connected to the die pad 200 in such a manner that the connection portion 111 extends between the end portions of the inner leads 101 and the die pad 200, so as to expose the connection portion 111 in the opening 307 in the same manner that the end portions of the second inner leads 102 are exposed. This allows connection between the exposed connection portion 111 and the photoelectron element 303 by wiring. This makes it unnecessary to provide the necessary lead for reference potential setting such as a ground in the die pad 200, so that the size of the resin package in the X axis direction can be reduced further.

The photoelectron element 303 includes a light-emitting device and a photoreceptor, although not shown in detail in the drawings. The light-emitting device irradiates an optical disk with a light beam, and reflected light therefrom is received by the photoreceptor.

The electrodes of the photoelectron element 303 are connected to the leads exposed in the opening, such as the end portions of the first inner leads 101, by wiring (not shown), so as to establish electric connections. Thereafter, optical members (lens, hologram, transparent resin, etc.) are provided on the photoelectron element 303 to seal the opening 307.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A lead frame comprising:
a die pad comprising a die pad main portion having a first thickness and a die pad peripheral portion having a second thickness smaller than that of the die pad main portion, provided on at least one side of the die pad main portion;
at least one support lead connected to the die pad; and
at least two first inner leads having a third thickness smaller than that of the die pad peripheral portion, arranged such that end portions thereof are opposed to the die pad peripheral portion.

2. The lead frame according to claim 1, further comprising a thin second inner lead having a thickness substantially the same as that of the first inner leads,
wherein the second inner lead extends substantially in a same direction as the first inner leads, and
an end portion of the second inner lead is positioned between the end portions of the first inner leads and the die pad peripheral portion.

3. The lead frame according to claim 1, wherein first outer leads having a thickness and a width larger than those of the end portions of the first inner leads are provided continuously from the first inner leads.

4. The lead frame according to claim 1, which is manufactured by processes including rolling.

5. The lead frame according to claim 1, wherein an upper surface of the die pad, an upper surface of the support lead, and an upper surface of the first inner lead are on a substantially common plane.

6. A lead frame comprising:
a die pad comprising a die pad main portion having a first thickness;
at least one support lead connected to the die pad; and
at least three first inner leads having a thickness smaller than that of the die pad main portion, arranged such that end portions thereof are opposed to at least one side of the die pad,
wherein each first inner lead has a narrow portion having a first width and a wide portion having a width larger than that of the narrow portion, the narrow portion positioned on the die pad side, the wide portion positioned on a side opposite to the die pad,
a connection point between the narrow portion and the wide portion of a central first inner lead of the at least three first inner leads is positioned farther from the die pad than connection points between the narrow portions and the wide portions of first inner leads adjacent to the central first inner lead, and
a gap between the central first inner lead and the adjacent first inner leads is smaller in the narrow portion than in the wide portion.

7. The lead frame according to claim 6, further comprising a thin second inner lead having a thickness substantially the same as that of the first inner leads,
wherein the second inner lead extends substantially in a same direction as the first inner leads, and
an end portion of the second inner lead is positioned between the end portions of the first inner leads and the die pad.

8. The lead frame according to claim 7, wherein a plurality of the second inner leads are provided such that the first inner leads are interposed between the second inner leads.

9. The lead frame according to claim 7, wherein an outer edge of the end portion of the second inner lead in a direction of a side of the die pad opposing the end portions of the first inner leads is positioned within a range defined by the width of the die pad in that direction.

10. A lead frame comprising a belt-shaped thick region having a first thickness and belt-shaped thin regions having a thickness smaller than that of the thick region,
the belt-shaped thick region and the belt-shaped thin regions being parallel to each other along a longitudinal direction of the lead frame,
the belt-shaped thin regions being arranged on both sides of the belt-shaped thick region,
wherein a die pad is formed in the thick region, and leads are formed in the thin regions, and
the leads extend in a direction substantially perpendicular to that of the belt-shaped regions.

11. The lead frame according to claim 10, wherein
the lead includes a plurality of first inner leads,
end portions of the first inner leads are opposed to the die pad, and
both widths and gaps of the first inner leads are smaller on the end portion side than on a side opposite thereto.

12. The lead frame according to claim 10, wherein the thick region and the thin region are formed by rolling.

13. The lead frame according to claim 10, further comprising at least one belt-shaped intermediate region having an intermediate thickness between the belt-shaped thick region and the belt-shape thin region in parallel,
wherein the belt-shaped intermediate region is formed so that a change in thickness between the belt-shaped thick region and the belt-shape thin region occurs stepwise.

14. The lead frame according to claim 10, wherein an upper surface of the thick region and an upper surface of the thin region are on a substantially common plane.

15. A resin package comprising:
a die pad comprising a die pad main portion having a first thickness and a die pad peripheral portion having a second thickness smaller than that of the die pad main portion, provided on at least one side of the die pad main portion;

at least one support lead connected to the die pad;

at least two first inner leads having a third thickness smaller than that of the die pad peripheral portion, arranged such that end portions thereof are opposed to the die pad peripheral portion; and a resin for sealing the die pad, the support lead and the first inner leads for integration while exposing a part of an upper surface and a part of a lower surface of the die pad and upper surfaces of the end portions of the first inner leads.

16. The resin package according to claim 15, wherein a length of a portion of the first inner leads covered with the resin is longer than a length of exposed portions of the first inner leads.

17. The resin package according to claim 15, wherein upper and lower surfaces of at least a part of a side different from the side of the die pad to which the first inner leads are opposed is covered by the resin.

18. The resin package according to claim 15, wherein each first inner lead has a narrow portion having a first width and a wide portion having a width larger than that of the narrow portion, the narrow portion positioned on the die pad side, and the wide portion positioned on a side opposite to the die pad, gaps between the first inner leads are wider in the wide portion than in the narrow portion, and at least the wide portion is covered with the resin.

19. A resin package comprising:

a die pad comprising a die pad main portion having a first thickness;

at least one support lead connected to the die pad;

at least three first inner leads having a thickness smaller than that of the die pad main portion, arranged such that end portions thereof are opposed to at least one side of the die pad, a resin for sealing the die pad, the support lead and the first inner leads for integration while exposing a part of an upper surface and a part of a lower surface of the die pad and upper surfaces of the end portions of the first inner leads, wherein each first inner lead has a narrow portion having a first width and a wide portion having a width larger than that of the narrow portion, the narrow portion being positioned on the die pad side, the wide portion being positioned on a side opposite to the die pad, a connection point between the narrow portion and the wide portion of a central first inner lead of the at least three first inner leads is positioned farther from the die pad than connection points between the narrow portions and the wide portions of first inner leads adjacent to the central first inner lead, and a gap between the central first inner lead and the adjacent first inner leads is smaller in the narrow portion than in the wide portion.

20. The resin package according to claim 19, wherein the part of an upper surface of the die pad and the upper surfaces of the end portions of the first inner leads are exposed by forming an opening, and a width of the opening in a direction of a side of the die pad opposing the first inner leads is smaller on the end portion side of the first inner leads than on the die pad portion side.

21. A photoelectron device comprising:

the resin package according to claim 15;

a photoelectron element mounted on an upper surface of the die pad; and an optically transparent member for sealing the photoelectron element.

22. The photoelectron device according to claim 21, wherein the photoelectron element comprises a light source for emitting light with which a recording medium is irradiated, and a photoreceptor for receiving reflected light from the recording medium.

23. A photoelectron device comprising:

the resin package according to claim 19;

a photoelectron element mounted on an upper surface of the die pad; and an optically transparent member for sealing the photoelectron element.

* * * * *